United States Patent
Moriwaki

(10) Patent No.: US 10,705,230 B2
(45) Date of Patent: Jul. 7, 2020

(54) IMAGING PANEL

(71) Applicant: Sharp Kabushiki Kaisha, Sakai, Osaka (JP)

(72) Inventor: Hiroyuki Moriwaki, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/367,308

(22) Filed: Mar. 28, 2019

(65) Prior Publication Data
US 2019/0302282 A1 Oct. 3, 2019

(30) Foreign Application Priority Data
Mar. 29, 2018 (JP) .................... 2018-064893

(51) Int. Cl.
*G01T 1/20* (2006.01)
*H01L 27/146* (2006.01)
*G01T 1/208* (2006.01)

(52) U.S. Cl.
CPC ............ *G01T 1/2018* (2013.01); *G01T 1/208* (2013.01); *H01L 27/14663* (2013.01)

(58) Field of Classification Search
CPC . G01T 1/2018; G01T 1/208; H01L 27/14612; H01L 27/14618; H01L 27/1462; H01L 27/14663; H01L 27/14692
See application file for complete search history.

(56) References Cited

U.S. PATENT DOCUMENTS

| | | | | |
|---|---|---|---|---|
| 2008/0302970 A1* | 12/2008 | Fujieda | ................. | G01T 1/2018 250/370.11 |
| 2009/0250699 A1* | 10/2009 | Okada | ............... | H01L 27/14636 257/53 |
| 2010/0224784 A1* | 9/2010 | Homma | ..................... | G01T 1/20 250/368 |
| 2011/0141550 A1* | 6/2011 | Ishida | ............... | G02F 1/136204 359/296 |
| 2012/0001282 A1* | 1/2012 | Goto | .................... | C09K 11/628 257/429 |
| 2012/0223240 A1* | 9/2012 | Ichimura | ................. | G01T 1/202 250/369 |
| 2012/0267539 A1* | 10/2012 | Shinba | ............. | H01L 31/02322 250/366 |

(Continued)

FOREIGN PATENT DOCUMENTS

JP 6074111 B2 2/2017

*Primary Examiner* — Mark R Gaworecki
(74) *Attorney, Agent, or Firm* — Keating & Bennett, LLP

(57) ABSTRACT

The invention achieves preventing from moisture penetration into an imaging panel without deterioration in detection accuracy of scintillation light. An imaging panel includes an active matrix substrate having a plurality of pixels each provided with a photoelectric conversion element, a scintillator provided on a surface of the active matrix substrate, a damp-proof material covering the active matrix substrate and the scintillator, and an adhesive layer bonding the damp-proof material to the scintillator and the active matrix substrate. The active matrix substrate includes a first flattening film overlapped in a planar view with the scintillator and configured as a photosensitive resin film. The first flattening film is entirely disposed, in a planar view, inside an adhesive layer region provided with the adhesive layer.

11 Claims, 16 Drawing Sheets

(56) References Cited

U.S. PATENT DOCUMENTS

| | | | |
|---|---|---|---|
| 2013/0313667 A1* | 11/2013 | Homma | G01T 1/2018 257/428 |
| 2014/0284487 A1* | 9/2014 | Sawada | G01T 1/2002 250/368 |
| 2015/0060678 A1* | 3/2015 | Watano | G01T 1/202 250/367 |
| 2015/0204986 A1* | 7/2015 | Nariyuki | A61B 6/4283 250/369 |
| 2015/0276940 A1* | 10/2015 | Watano | B29C 48/0011 250/366 |
| 2016/0181308 A1* | 6/2016 | Ichimura | A61B 6/4233 257/428 |
| 2016/0380021 A1 | 12/2016 | Ito | |
| 2017/0254908 A1* | 9/2017 | Homma | H01L 27/14618 |
| 2018/0011206 A1* | 1/2018 | Ichimura | G01T 7/00 |
| 2018/0074216 A1* | 3/2018 | Yoshida | H01L 31/032 |
| 2018/0275287 A1* | 9/2018 | Itaya | G21K 4/00 |

\* cited by examiner

IMAGING PANEL

TECHNICAL FIELD

The present invention relates to an imaging panel.

BACKGROUND ART

An X-ray imaging device conventionally includes an active matrix substrate having a photoelectric conversion element provided in each pixel and connected to a switching element. Patent Literature 1 discloses a technique for preventing from moisture penetration into such an X-ray imaging device. The X-ray imaging device according to Patent Literature 1 prevents from moisture penetration through an adhesive agent bonding a damp-proof protective layer for a phosphor layer provided on a photoelectric conversion substrate and the photoelectric conversion substrate. Specifically, the photoelectric conversion substrate is provided thereon with a surface organic film made of polyimide or the like, and the surface organic film is provided with a groove that extends along the outer periphery of the phosphor layer and is filled with a resin.

CITATION LIST

Patent Literature

Patent Literature 1: JP 6074111 B1

In the Patent Literature 1, the surface organic film having damp-proof effect is provided on the photoelectric conversion substrate, and the surface organic film has the groove filled with the resin, so that the adhesive agent is less likely to gather and moisture is less likely to enter the photoelectric conversion substrate. This achieves to some extent prevent from moisture penetration into the phosphor layer through the photoelectric conversion substrate. The surface organic film, which is made of polyimide or the like and has several tens of micrometers in thickness, has the damp-proof effect but absorbs light in a wavelength region of scintillation light to cause deterioration in detection accuracy of the scintillation light.

SUMMARY OF INVENTION

The present invention provides a technique for preventing from moisture penetration into an imaging panel without deterioration in detection accuracy of scintillation light.

In order to achieve the object mentioned above, the present invention provides an imaging panel including: an active matrix substrate having a pixel region provided with a plurality of pixels each including a photoelectric conversion element; a scintillator provided on a surface of the active matrix substrate and configured to convert an X-ray to scintillation light; a damp-proof material covering the active matrix substrate and the scintillator; and an adhesive layer bonding the damp-proof material to the scintillator and the active matrix substrate; in which the active matrix substrate includes a first flattening film provided to be overlapped in a planar view with the scintillator and configured as a photosensitive resin film, and the first flattening film is entirely disposed, in a planar view, inside an adhesive layer region provided with the adhesive layer.

The present invention achieves preventing from moisture penetration into an imaging panel without deterioration in detection accuracy of scintillation light.

DESCRIPTION OF EMBODIMENTS

Figure 1:
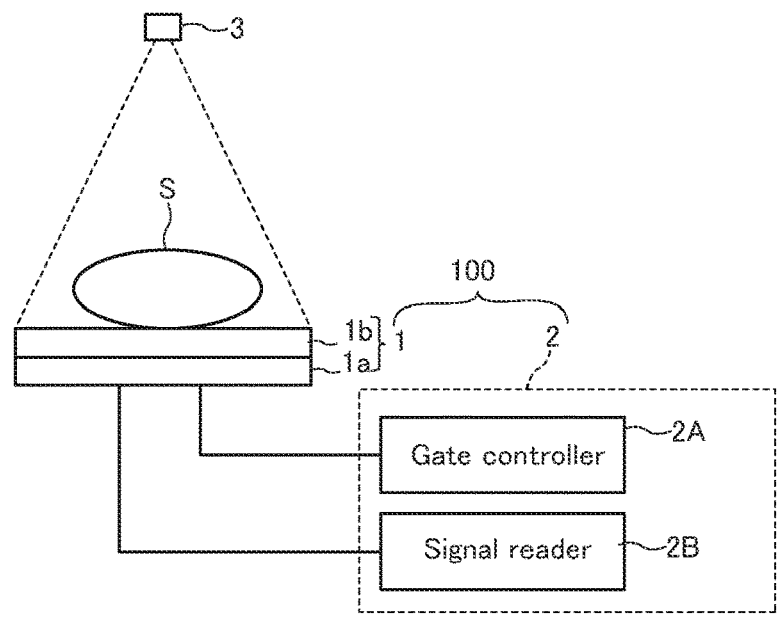
FIG. 1 is a pattern diagram of an X-ray imaging device according to a first embodiment.

An imaging panel according to an embodiment of the present invention includes: an active matrix substrate having a pixel region provided with a plurality of pixels each including a photoelectric conversion element; a scintillator provided on a surface of the active matrix substrate and configured to convert an X-ray to scintillation light; a damp-proof material covering the active matrix substrate and the scintillator; and an adhesive layer bonding the damp-proof material to the scintillator and the active matrix substrate; in which the active matrix substrate includes a first flattening film provided to be overlapped in a planar view with the scintillator and configured as a photosensitive resin film, and the first flattening film is entirely disposed, in a planar view, inside an adhesive layer region provided with the adhesive layer (a first configuration).

In the imaging panel according to the first configuration, the scintillator provided on the active matrix substrate is covered with the damp-proof material while the adhesive layer is interposed therebetween. The active matrix substrate includes the first flattening film overlapped in a planar view with the scintillator and configured as a photosensitive resin film. The first flattening film is higher in hygroscopicity than the adhesive layer at high temperature and high humidity, and moisture may enter the active matrix substrate through the first flattening film. The first flattening film according to the present configuration is entirely disposed inside the adhesive layer region in a planar view. The first flattening film is thus not exposed to outside air. This configuration is less likely to allow moisture penetration through the first flattening film, to prevent from moisture penetration into the scintillator as well as preventing from deterioration in detection accuracy due to such moisture penetration.

In the first configuration, optionally, the first flattening film has an end that is disposed in a planar view between a boundary of a scintillator region provided with the scintillator and a boundary of the adhesive layer region, and is covered with the adhesive layer (a second configuration).

According to the second configuration, the end of the first flattening film is disposed, in a planar view, outside the scintillator region and inside the adhesive layer region, and is covered with the adhesive layer. This configuration is thus less likely to allow moisture penetration through the first flattening film, to prevent from moisture penetration into the scintillator.

In the second configuration, optionally, the first flattening film has a first surface in contact with the scintillator, the active matrix substrate further includes a first inorganic film provided on a second surface of the first flattening film, and a second flattening film provided on a surface, not facing the first flattening film, of the first inorganic film, the second flattening film has an end that is disposed in a planar view between the end of the first flattening film and the boundary of the adhesive layer region and is covered with the first inorganic film, and the first inorganic film has a portion overlapped with the end of the second flattening film and covered with the adhesive layer (a third configuration).

In the active matrix substrate according to the third configuration, the first flattening film, the first inorganic film, and the second flattening film are overlapped with one another. The end of the second flattening film is disposed, in a planar view, between the end of the first flattening film and the boundary of the adhesive layer region, and is covered with the first inorganic film. The first inorganic film is covered with the adhesive layer, so that the end of the second flattening film is provided thereon with the first inorganic film and the adhesive layer. This configuration is less likely to allow moisture penetration through the end of the second flattening film, to prevent moisture penetration into the pixel region through the second flattening film.

In the second configuration, optionally, the first flattening film has a first surface in contact with the scintillator, the active matrix substrate further includes a first inorganic film provided on a second surface of the first flattening film, and a second flattening film provided on a surface, not facing the first flattening film, of the first inorganic film, the second flattening film has an end that is disposed in a planar view between the end of the first flattening film and the boundary of the scintillator region and is covered with the first inorganic film, and the first inorganic film has a portion overlapped with the end of the second flattening film and covered with the first flattening film (a fourth configuration).

In the active matrix substrate according to the fourth configuration, the first flattening film, the first inorganic film, and the second flattening film are overlapped with one another in a planar view. The end of the second flattening film is disposed between the end of the first flattening film and the boundary of the scintillator region, and is covered with the first inorganic film. The first inorganic film has the portion that is overlapped with the end of the second flattening film and covered with the first flattening film. The end of the second flattening film is thus provided thereon with the first inorganic film, the first flattening film, and the adhesive layer. This configuration is less likely to allow moisture penetration through the end of the second flattening film, to prevent from moisture penetration into the pixel region through the second flattening film.

In the first configuration, optionally, the active matrix substrate further includes a first inorganic film provided on a surface, not facing the scintillator, of the first flattening film, and a second inorganic film provided between the first flattening film and the scintillator, the first flattening film has a surface covered with the second inorganic film, and the second inorganic film has a portion overlapped with an end of the first flattening film and covered with the adhesive layer (a fifth configuration).

In the active matrix substrate according to the fifth configuration, the second inorganic film, the first flattening film, and the first inorganic film are overlapped with one another in a planar view. The second inorganic film, which covers the end of the first flattening film, is covered with the adhesive layer. The end of the first flattening film is provided thereon with the second inorganic film and the adhesive layer. This configuration is less likely to allow moisture penetration through the end of the first flattening film, to prevent from moisture penetration into the scintillator through the first flattening film. The first inorganic film is provided on the surface, not facing the scintillator, of the first flattening film. Even in a case where moisture enters the first flattening film, the moisture is less likely to enter the pixel region through the first inorganic film.

In the fifth configuration, optionally, the active matrix substrate further includes a second flattening film provided to oppose the first flattening film with the first inorganic film being interposed therebetween, and configured as a photosensitive resin film, the second flattening film has an end that is disposed in a planar view between the end of the first flattening film and a boundary of the adhesive layer region and is covered with the first inorganic film, and the first inorganic film has a portion overlapped with the end of the second flattening film and covered with the second inorganic film (a sixth configuration).

According to the sixth configuration, the first flattening film, the first inorganic film, and the second flattening film are overlapped with one another in a planar view. The end of the second flattening film is disposed, in a planar view, between the end of the first flattening film and the boundary of the adhesive layer region, and is covered with the first inorganic film. The end of the second flattening film is thus provided thereon with the first inorganic film and the second inorganic film. This configuration is less likely to allow moisture penetration to the end of the second flattening film in comparison to a case where the end of the second flattening film is covered with a single inorganic film.

In the fifth configuration, optionally, the active matrix substrate further includes a second flattening film provided to oppose the first flattening film with the first inorganic film being interposed therebetween, and configured as a photosensitive resin film, the second flattening film is entirely disposed, in a planar view, inside the first flattening film, and the first inorganic film has a portion overlapped with an end of the second flattening film and covered with the first flattening film (a seventh configuration).

In the active matrix substrate according to the seventh configuration, the second flattening film is provided inside the first flattening film, and the end of the second flattening film is provided thereon with the first inorganic film and the first flattening film. The surface of the first flattening film is covered with the second inorganic film. The end of the second flattening film is thus provided thereon with the first inorganic film, the first flattening film, and the second inorganic film. This configuration is less likely to allow moisture penetration through the end of the second flattening film in comparison to the sixth configuration.

In the first configuration, optionally, the first flattening film has a first surface in contact with the scintillator, and the first flattening film has an end covered with the scintillator (an eighth configuration).

According to the eighth configuration, the end of the first flattening film is covered with the scintillator. This configuration is less likely to allow moisture penetration through the end of the first flattening film, to prevent from moisture penetration into the scintillator through the first flattening film.

In the eighth configuration, optionally, the active matrix substrate further includes a first inorganic film provided on a second surface of the first flattening film, and a second flattening film provided on a surface, not facing the first flattening film, of the first inorganic film, the second flattening film has an end that is disposed in a planar view between the end of the first flattening film and a boundary of a region provided with the scintillator, and is covered with the first inorganic film, and the first inorganic film has a portion overlapped with the end of the second flattening film and covered with the scintillator (a ninth configuration).

According to the ninth configuration, the first flattening film, the first inorganic film, and the second flattening film are layered on the active matrix substrate. The end of the second flattening film is disposed, in a planar view, between the end of the first flattening film and the boundary of the region provided with the scintillator, and is covered with the first inorganic film. The end of the second flattening film is provided thereon with the first inorganic film and the scintillator, and the adhesive layer and the damp-proof material are overlapped on the scintillator. The end of the second flattening film is thus not exposed to outside air. This configuration is less likely to allow moisture penetration through the end of the second flattening film, to prevent from moisture penetration into the pixel region through the second flattening film.

In the eighth configuration, optionally, the active matrix substrate further includes a first inorganic film provided on a surface, not facing the scintillator, of the first flattening film, and a second inorganic film in contact with the first flattening film and the scintillator, the end of the first flattening film is covered with the second inorganic film, and the second inorganic film has a portion overlapped with the end of the first flattening film and covered with the scintillator (a tenth configuration).

According to the tenth configuration, the second inorganic film, the first flattening film, and the first inorganic film are layered on the active matrix substrate. The end of the first flattening film is covered with the second inorganic film that is covered with the scintillator. The end of the first flattening film is thus provided thereon with the second inorganic film and the scintillator, so as not to be exposed. This configuration is less likely to allow moisture penetration into the scintillator through the first flattening film.

In the tenth configuration, optionally, the active matrix substrate further includes a second flattening film provided to oppose the first flattening film with the first inorganic film being interposed therebetween, and configured as a photosensitive resin film, the second flattening film has an end that is disposed in a planar view between the end of the first flattening film and a boundary of a region provided with the scintillator, and is covered with the first inorganic film, and the first inorganic film has a portion overlapped with the end of the second flattening film and covered with the second inorganic film (an eleventh configuration).

According to the eleventh configuration, the second inorganic film, the first flattening film, the first inorganic film, and the second flattening film are layered on the active matrix substrate. The end of the second flattening film is disposed between the end of the first flattening film and the boundary of the region provided with the scintillator, and is covered with the first inorganic film. The end of the second flattening film is thus provided thereon with two inorganic films, namely, the first inorganic film and the second inorganic film. This configuration is less likely to allow moisture penetration through the end of the second flattening film, to prevent from moisture penetration into the pixel region through the second flattening film, in comparison to a case where the end of the second flattening film is covered with a single inorganic film.

An embodiment of the present invention will now be described in detail below with reference to the drawings. Identical or corresponding portions in the drawings will be denoted by identical reference signs and will not be described repeatedly.

First Embodiment (Configuration)

FIG. 1 is a pattern diagram of an X-ray imaging device including an imaging panel according to the present embodiment. An X-ray imaging device 100 includes an imaging panel 1 having an active matrix substrate 1a and a scintillator 1b, as well as a controller 2.

The controller 2 includes a gate controller 2A and a signal reader 2B. There is provided an X-ray source 3 configured to apply X-rays to a subject S. The X-rays having been transmitted through the subject S are converted to fluorescence (hereinafter, referred to as scintillation light) by the scintillator 1b disposed on the active matrix substrate 1a. The X-ray imaging device 100 captures the scintillation light by means of the imaging panel 1 and the controller 2 to obtain an X-ray image.

Figure 2:
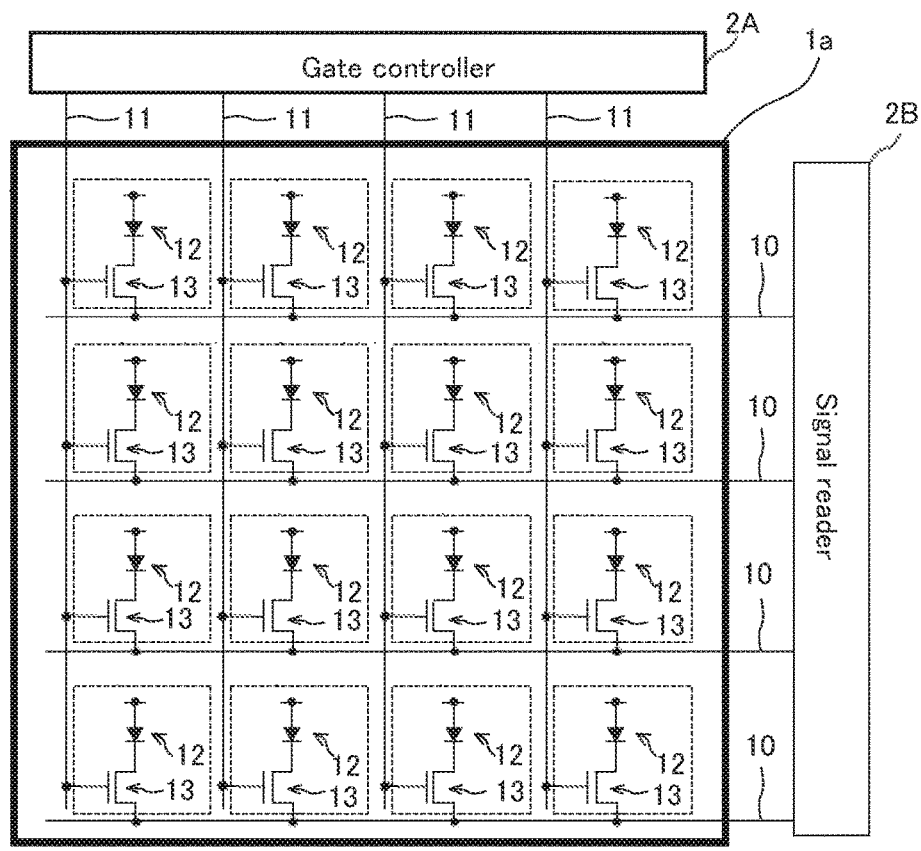
FIG. 2 is a pattern diagram showing a schematic configuration of an active matrix substrate in FIG. 1.

FIG. 2 is a pattern diagram depicting a schematic configuration of the active matrix substrate 1a. As shown in FIG. 2, the active matrix substrate 1a is provided with a plurality of source lines 10 and a plurality of gate lines 11 crossing the source lines 10. The gate lines 11 are connected to the gate controller 2A whereas the source lines 10 are connected to the signal reader 2B.

The active matrix substrate 1a includes TFTs 13 positioned at intersections between the source lines 10 and the gate lines 11 and each connected to a corresponding one of the source lines 10 and a corresponding one of the gate lines 11. The source lines 10 and the gate lines 11 surround to define regions (hereinafter, referred to as pixels) that are each provided with a photodiode 12. The photodiode 12 in each of the pixels converts the scintillation light obtained through conversion from the X-rays having been transmitted through the subject S to electric charge according to quantity of the scintillation light.

The gate lines 11 provided at the active matrix substrate 1a are sequentially switched into a selected state by the gate controller 2A, and the TFT 13 connected to the gate line 11 in the selected state is brought into an ON state. When the TFT 13 comes into the ON state, a signal according to the electric charge obtained through conversion by the photodiode 12 is transmitted to the signal reader 2B via the source line 10.

Figure 3:
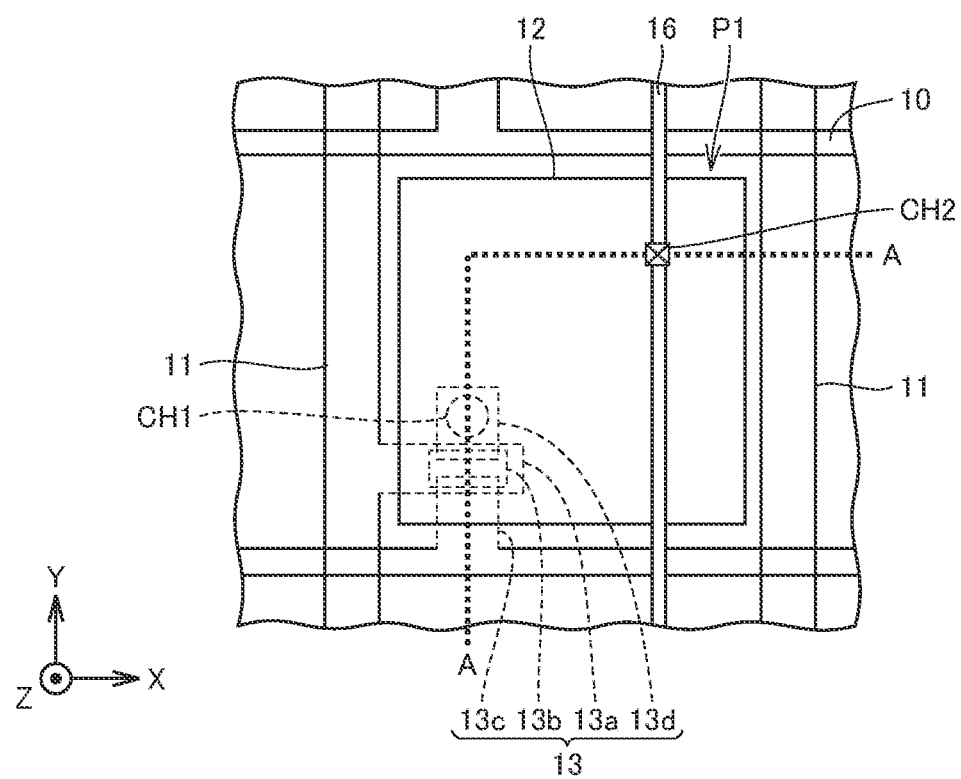
FIG. 3 is an enlarged partial plan view of a pixel part provided with a pixel on the active matrix substrate shown in FIG. 2.

FIG. 3 is an enlarged plan view of part of the pixels at the active matrix substrate 1a shown in FIG. 2.

As shown in FIG. 3, the gate lines 11 and the source lines 10 surround a pixel P1 provided with the photodiode 12 and the TFT 13.

The photodiode 12 includes a pair of electrodes and a photoelectric conversion layer provided between the pair of electrodes. The TFT 13 includes a gate electrode 13a provided integrally with the gate line 11, a semiconductor active layer 13b, a source electrode 13c provided integrally with the source line 10, and a drain electrode 13d. The drain electrode 13d and one of the electrodes of the photodiode 12 are connected to each other via a contact hole CH1.

The gate electrode 13a or the source electrode 13c may not necessarily be provided integrally with the gate line 11 or the source line 10, respectively. Alternatively, the gate electrode 13a and the gate line 11 may be disposed in different layers and be connected to each other via a contact hole. Furthermore, the source electrode 13c and the source line 10 may be disposed in different layers and be connected to each other via a contact hole. Such a configuration achieves reduction in resistance of the gate line 11 and the source line 10.

There is provided a bias line 16 overlapped with the photodiode 12 in the pixel, and the photodiode 12 and the bias line 16 are connected to each other via a contact hole CH2. The bias line 16 is configured to supply the photodiode 12 with bias voltage.

Figure 4A:
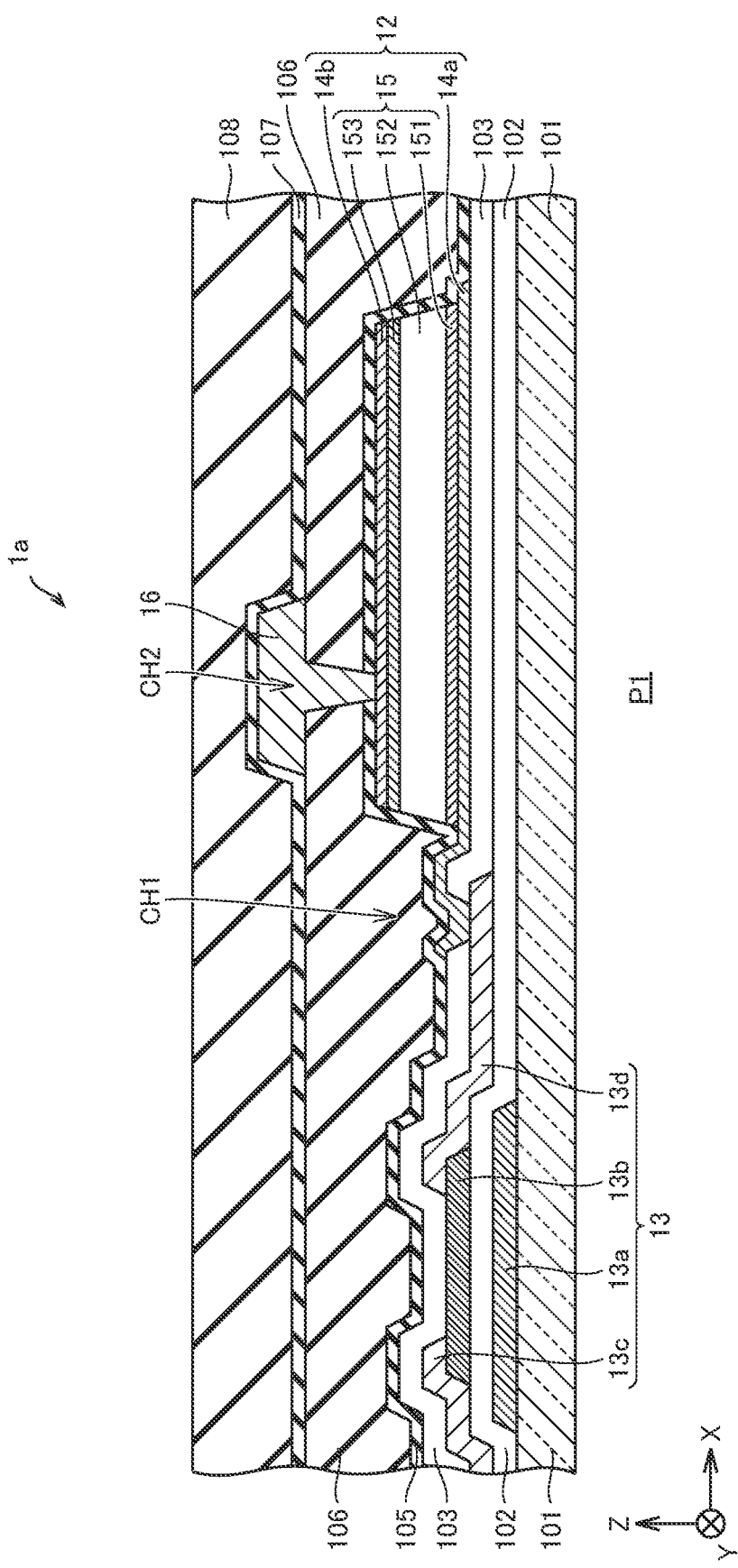
FIG. 4A is a sectional view taken along line A-A of the pixel part shown in FIG. 3.

The pixel P1 will be described below in terms of a sectional structure taken along line A-A. FIG. 4A is a sectional view taken along line A-A of the pixel P1 shown in FIG. 3. FIG. 4A shows a substrate 101 provided thereon with the gate electrode 13a integrated with the gate line 11 (see FIG. 3), and a gate insulating film 102. The substrate 101 exhibits insulation effect and is configured as a glass substrate or the like.

The gate electrode 13a and the gate line 11 according to the present example may be configured as a metal film including tungsten (W) and tantalum (Ta) layered in the mentioned order from the bottom, and having about 100 nm to 1000 nm in thickness. Each of the gate electrode 13a and the gate line 11 is not limited to such a two-layer structure, but may alternatively have a single layer or a plurality of layers including at least two layers and is not limited to the above exemplification in terms of its material and thickness.

The gate insulating film 102 covers the gate electrode 13a. The gate insulating film 102 according to the present example has a layered structure including two inorganic insulating films. The two inorganic insulating films may be made of silicon nitride ($SiN_x$) and silicon oxide ($SiO_x$) in the mentioned order from the bottom. The gate insulating film 102 is preferred to have about 100 nm to 1000 nm in thickness. The gate insulating film 102 is not limited to such a two-layer structure, but may alternatively have a single layer or a plurality of layers including at least two layers. The gate insulating film 102 is not limited to the above exemplification in terms of its material and thickness.

The gate electrode 13a is provided thereabove, while the gate insulating film 102 is interposed therebetween, with the semiconductor active layer 13b, as well as the source electrode 13c and the drain electrode 13d connected to the semiconductor active layer 13b.

The semiconductor active layer 13b is disposed in contact with the gate insulating film 102. The semiconductor active layer 13b is made of an oxide semiconductor. The oxide semiconductor is exemplified by an amorphous oxide semiconductor containing indium (In), gallium (Ga), and zinc (Zn) at predetermined ratios. The semiconductor active layer 13b is preferred to exemplarily have about 100 nm in thickness in this case. The semiconductor active layer 13b is, however, not limited to the above exemplification in terms of its material and thickness.

The source electrode 13c and the drain electrode 13d are disposed on the gate insulating film 102 and are in contact with part of the semiconductor active layer 13b. The source electrode 13c according to the present example is provided integrally with the source line 10 (see FIG. 3). The source electrode 13c and the drain electrode 13d have a layered structure including three metal films. The three metal films may be made of titanium (Ti), aluminum (Al), and titanium (Ti) in the mentioned order from the bottom. The source electrode 13c and the drain electrode 13d are preferred to exemplarily have about 100 nm to 1000 nm in thickness in this case. Each of the source electrode 13c and the drain electrode 13d is not limited to such a three-layer structure, but may alternatively have a single layer or a plurality of layers including at least two layers. Each of the source electrode 13c and the drain electrode 13d is not limited to the above exemplification in terms of its material and thickness.

The gate insulating film 102 is provided thereon with a first insulating film 103 that is overlapped with the source electrode 13c and the drain electrode 13d. The first insulating film 103 has the contact hole CH1 positioned above the drain electrode 13d. The first insulating film 103 according to the present example has a layered structure including two inorganic insulating films. The two inorganic insulating films may be made of silicon oxide ($SiO_x$) and silicon nitride ($SiN_x$) in the mentioned order from the bottom. The first insulating film 103 is preferred to have about 100 nm to 1000 nm in thickness in this case. The first insulating film 103 is not limited to such a two-layer structure, but may alternatively have a single layer or a plurality of layers including at least two layers. The first insulating film 103 configured by a single layer is made only of silicon oxide ($SiO_x$). The first insulating film 103 is not limited to the above exemplification in terms of its material and thickness.

The first insulating film 103 is provided thereon with one of the electrodes (hereinafter, called a lower electrode) 14a of the photodiode 12, and a second insulating film 105. The lower electrode 14a is connected to the drain electrode 13d via the contact hole CH1.

The lower electrode 14a according to the present example has a layered structure including three metal films. The three metal films may exemplarily be made of titanium (Ti), aluminum (Al), and titanium (Ti) in the mentioned order from the bottom. The lower electrode 14a is preferred to have about 100 nm to 1000 nm in thickness in this case. The lower electrode 14a is not limited to such a three-layer structure, but may alternatively have a single layer or a plurality of layers including at least two layers. The lower electrode 14a is not limited to the above exemplification in terms of its material and thickness.

The lower electrode 14a is provided thereon with a photoelectric conversion layer 15, and the lower electrode 14a and the photoelectric conversion layer 15 are connected to each other.

The photoelectric conversion layer 15 includes an n-type amorphous semiconductor layer 151, an intrinsic amorphous semiconductor layer 152, and a p-type amorphous semiconductor layer 153 layered in the mentioned order.

The n-type amorphous semiconductor layer 151 is made of amorphous silicon doped with an n-type impurity (e.g. phosphorus).

The intrinsic amorphous semiconductor layer 152 is made of intrinsic amorphous silicon. The intrinsic amorphous semiconductor layer 152 is provided in contact with the n-type amorphous semiconductor layer 151.

The p-type amorphous semiconductor layer 153 is made of amorphous silicon doped with a p-type impurity (e.g. boron). The p-type amorphous semiconductor layer 153 is provided in contact with the intrinsic amorphous semiconductor layer 152.

The n-type amorphous semiconductor layer 151, the intrinsic amorphous semiconductor layer 152, and the p-type amorphous semiconductor layer 153 according to the present example are preferred to exemplarily have about 1 nm to 100 nm, about 500 nm to 2000 nm, and about 1 nm to 100 nm in thickness, respectively. Each of the n-type amorphous semiconductor layer 151, the intrinsic amorphous semiconductor layer 152, and the p-type amorphous semiconductor layer 153 is not limited to the above exemplification in terms of its dopant and thickness.

The p-type amorphous semiconductor layer 153 is provided thereon with another one of the electrodes (hereinafter, called an upper electrode) 14b of the photodiode 12. The upper electrode 14b is exemplarily configured by a transparent conductive film made of indium tin oxide (ITO). The upper electrode 14b is preferred to exemplarily have about 10 nm to 100 nm in thickness in this case. The upper electrode 14b is, however, not limited to the above exemplification in terms of its material and thickness.

The second insulating film 105 is provided on the first insulating film 103, the lower electrode 14a, and the upper electrode 14b, and a third insulating film 106 is provided on the second insulating film 105. The contact hole CH2 is positioned on the upper electrode 14b and penetrates the second insulating film 105 and the third insulating film 106.

The second insulating film 105 according to the present example is configured as an inorganic insulating film made of silicon oxide ($SiO_x$) or silicon nitride ($SiN_x$). The second insulating film 105 is preferred to exemplarily have about 100 nm to 1000 nm in thickness in this case. The second insulating film 105 is, however, not limited to the above exemplification in terms of its material and thickness. The third insulating film 106 is preferred to be configured as a flattening film made of a photosensitive acrylic resin and exemplarily have about 1.0 μm to 3.0 μm in thickness. The third insulating film 106 is, however, not limited to the above exemplification in terms of its material and thickness.

The third insulating film 106 is provided thereon with the bias line 16 that is connected to the upper electrode 14b via the contact hole CH2. The bias line 16 is connected to the controller 2 (see FIG. 1). The bias line 16 applies, to the upper electrode 14b, bias voltage received from the controller 2.

The bias line 16 according to the present example has a layered structure including a metal layer as a lower layer and a transparent conductive layer as an upper layer. The metal layer may include layered films exemplarily made of titanium (Ti), aluminum (Al), and titanium (Ti), and the transparent conductive layer may be exemplarily made of ITO or the like. The bias line 16 is preferred to have about 100 nm to 1000 nm in thickness. The bias line 16 may have a single layer or a plurality of layers including at least two layers. The bias line 16 is not limited to the above exemplification in terms of its material and thickness.

The third insulating film 106 is provided thereon with a fourth insulating film 107 that covers the bias line 16. The fourth insulating film 107 according to the present example may be configured as an inorganic insulating film made of silicon nitride ($SiN_x$), and is preferred to exemplarily have about 100 nm to 1000 nm in thickness. The fourth insulating film 107 is not limited to such a single layer structure including the single inorganic insulating film, but may alternatively have a layered structure including a plurality of inorganic insulating films. The fourth insulating film 107 is not limited to the above exemplification in terms of its material and thickness.

The fourth insulating film 107 is covered with a fifth insulating film 108. The fifth insulating film 108 is preferred to be configured as a flattening film made of a photosensitive resin and exemplarily have about 1.0 μm to 10.0 μm in thickness. The fifth insulating film 108 is, however, not limited to the above exemplification in terms of its material and thickness.

Figure 4B:
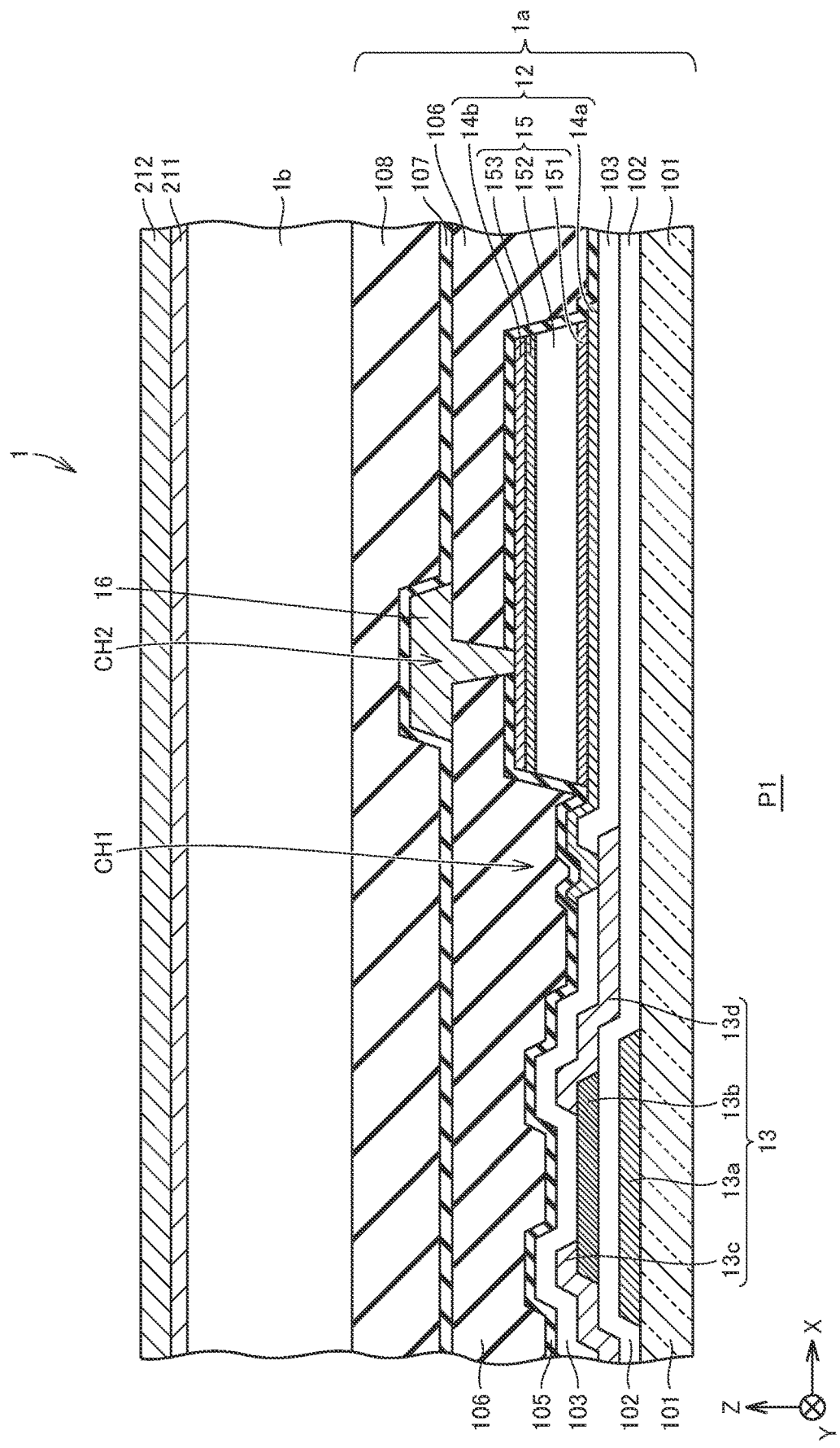
FIG. 4B is a sectional view of a pixel part in an imaging panel shown in FIG. 1.

The active matrix substrate 1a has the sectional structure described above in the single pixel P1. The scintillator 1b is provided on the active matrix substrate 1a in the imaging panel 1. FIG. 4B is a sectional view depicting a sectional structure of a pixel region in the imaging panel 1. As shown in FIG. 4B, the active matrix substrate 1a is provided thereon with the scintillator 1b covering the fifth insulating film 108, and there is provided a damp-proof material 212 that covers the scintillator 1b and is bonded to the scintillator 1b by means of an adhesive layer 211. The adhesive layer 211 is made of a photosetting resin, a thermosetting resin, a hot melt resin, or the like, and exhibits damp-proof effect. The damp-proof material 212 is exemplarily configured by an organic film having damp-proofness.

Figure 5A:
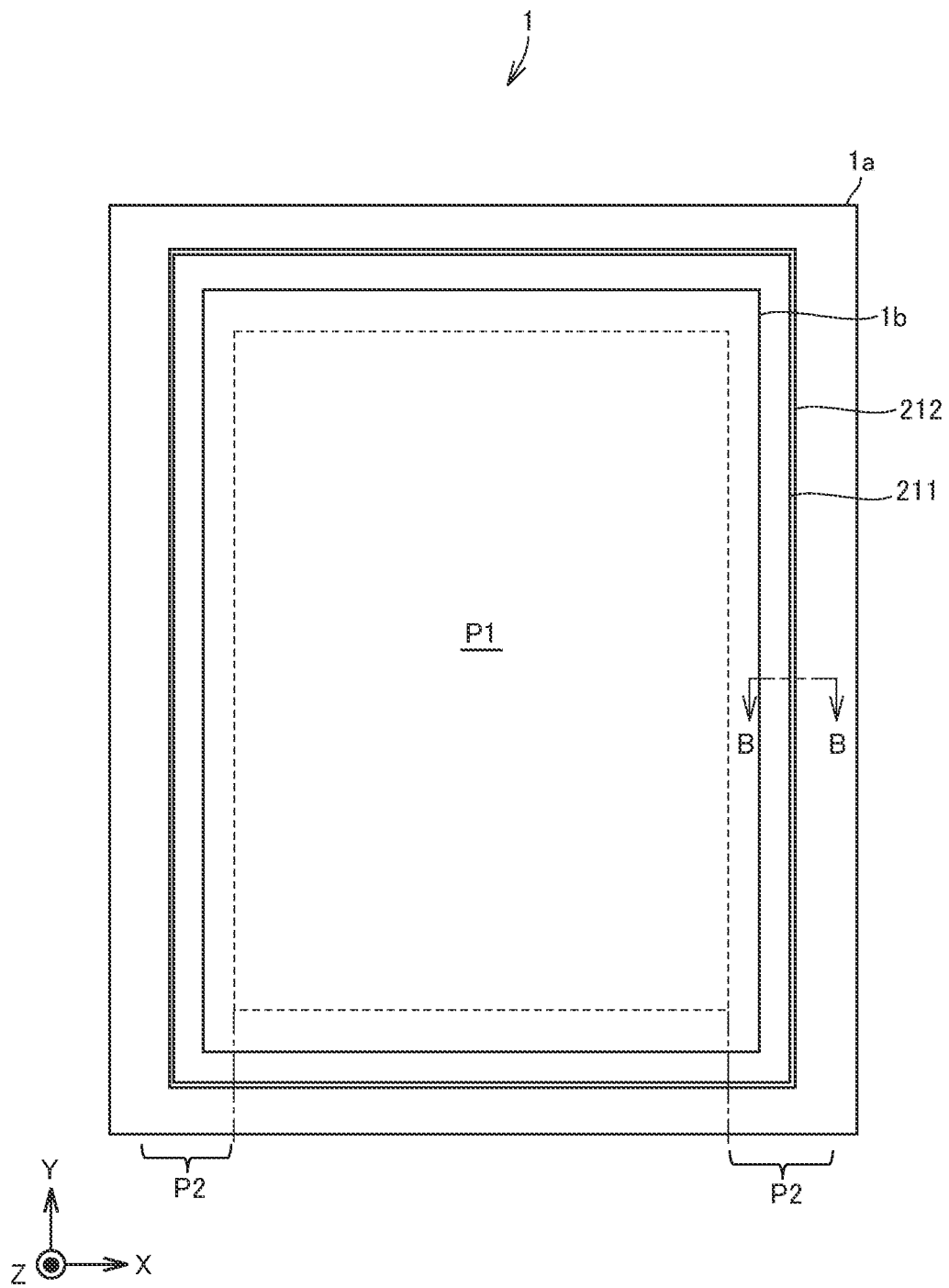
FIG. 5A is a schematic plan view of the imaging panel shown in FIG. 1.

Described next is a structure outside the entire pixel region in the imaging panel 1, in other words, a structure of an end region in the imaging panel 1. FIG. 5A is a schematic plan view of the imaging panel 1, and FIG. 5B is a sectional view taken along line B-B indicated in FIG. 5A and depicting an enlarged section of part of an end region P2 along a side of the active matrix substrate 1a.

Figure 5B:
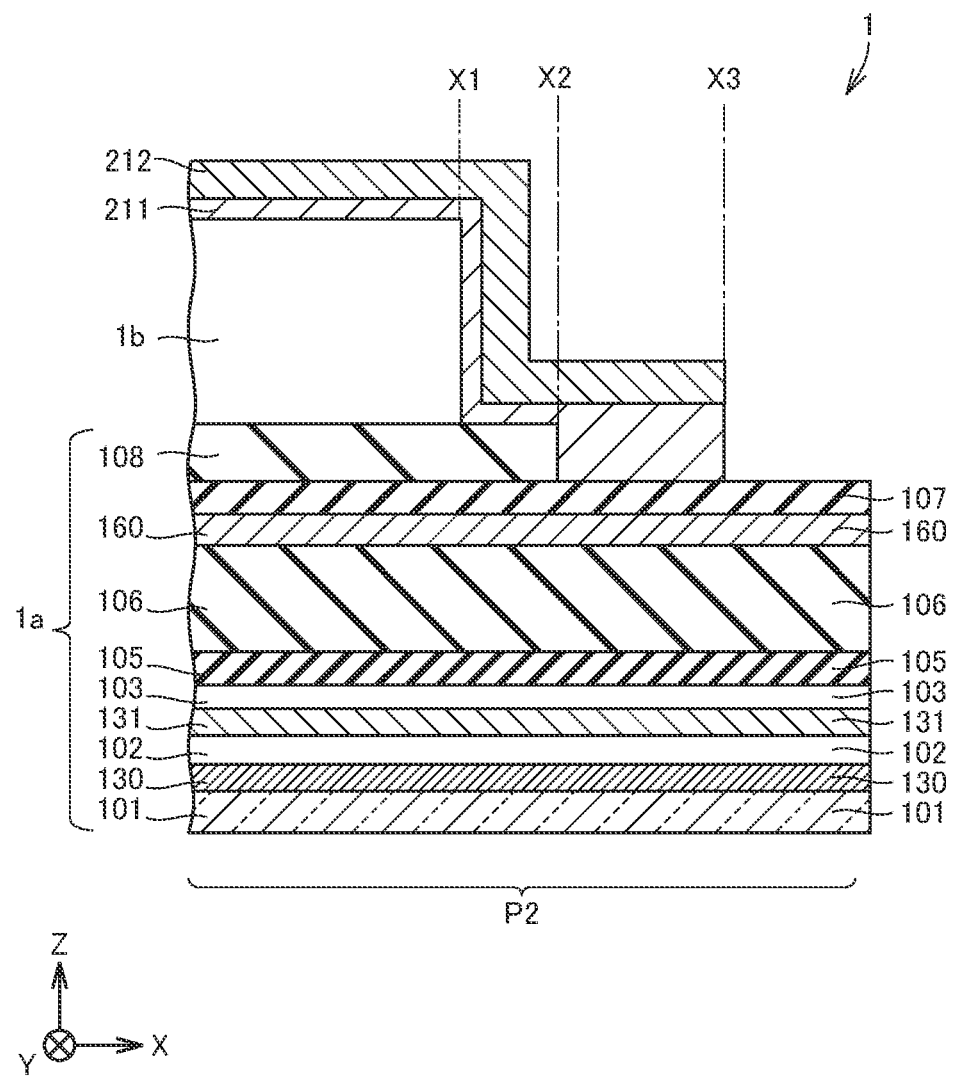
FIG. 5B is a sectional view taken along line B-B shown in FIG. 5A.

In FIGS. 5A and 5B, components identical to those shown in FIG. 4B are denoted by identical reference signs. The end region P2 will be specifically described below in terms of its structure. FIG. 5B shows the section of the end region along one of the sides of the active matrix substrate 1a for convenience. The remaining three sides are each assumed to have an end region configured similarly to that shown in FIG. 5B.

As shown in FIG. 5B, the end region P2 includes a gate layer 130 provided on the substrate 101 to be disposed in a layer including the gate electrode 13a, be made of the material same as that for the gate electrode 13a, and be provided thereon with the gate insulating film 102. The gate insulating film 102 is provided thereon with a source layer 131 that is disposed in a layer including the source electrode 13c and the drain electrode 13d, and is made of the material same as that for the source electrode 13c and the drain electrode 13d.

The gate layer 130 is connected, via a contact hole (not shown), to a gate terminal (not shown) provided outside the pixel region of the active matrix substrate 1a. The source layer 131 is connected, via a contact hole (not shown), to a source terminal (not shown) provided outside the pixel region of the active matrix substrate 1a.

The first insulating film 103 is provided on the source layer 131, and the second insulating film 105 is provided on the first insulating film 103. The second insulating film 105 is provided thereon with the third insulating film 106 (the second flattening film). The third insulating film 106 is provided thereon with a bias line layer 160 that is disposed in a layer including the bias line 16 and is made of the material same as that for the bias line 16.

Each of the gate layer 130, the source layer 131, and the bias line layer 160 may be extended from the pixel P1 to the end region P2. Outside the pixel P1, a metal film provided in a layer not including the gate line 11, the source line 10, or the bias line 16 may be connected to each of these lines via a contact hole.

The bias line layer 160 is provided thereon with the fourth insulating film 107 (the first inorganic film) that is provided thereon with the fifth insulating film 108 (the first flattening film).

The fifth insulating film 108 is provided thereon with the scintillator 1b that is provided thereon with the adhesive layer 211 covering the scintillator 1b and the fifth insulating film 108. The damp-proof material 212 is provided on the adhesive layer 211, and the scintillator 1b and the damp-proof material 212 are bonded to each other by means of the adhesive layer 211.

The fifth insulating film 108 is configured as a photosensitive resin film to be more likely to absorb moisture at high temperature and high humidity in comparison to the adhesive layer 211. According to the present example, the fifth insulating film 108 in the end region P2 has an end, along an X axis, which is disposed at a position X2 between a boundary X1 along the X axis of a region provided with the scintillator 1b (a scintillator region) and a boundary X3 along the X axis of a region provided with the adhesive layer 211 (an adhesive layer region), and the end of the fifth insulating film 108 is covered with the adhesive layer 211. The end of the fifth insulating film 108 according to the present embodiment is disposed inside the adhesive layer region so as not to be exposed to outside air. The end of the fifth insulating film 108 is thus less likely to allow moisture penetration, to achieve preventing from moisture penetration through the scintillator 1b.

Each of the layers provided in the end region P2 according to the present embodiment is made of the material same as that for a corresponding one of the layers provided in the pixel P1. The end region P2 can thus be prepared simultaneously with the pixel P1.

(Operation of X-Ray Imaging Device 100)

The X-ray imaging device 100 shown in FIG. 1 will be described below in terms of its operation. The X-ray source 3 initially emits X-rays. The controller 2 applies predetermined voltage (bias voltage) to the bias line 16 (see FIG. 3) in this case. The X-rays emitted from the X-ray source 3 are transmitted through the subject S and enter the scintillator 1b. The X-rays having entered the scintillator 1b are converted to fluorescence (scintillation light) that subsequently enters the active matrix substrate 1a. When the scintillation light enters the photodiode 12 provided in each of the pixels of the active matrix substrate 1a, the photodiode 12 converts the scintillation light to electric charge according to quantity of the scintillation light. When the TFT 13 (see FIG. 3 and the like) is in the ON state in accordance with gate voltage (positive voltage) transmitted from the gate controller 2A via the gate line 11, the signal reader 2B (see FIG. 2 and the like) reads, via the source line 10, a signal according to the electric charge obtained through conversion by the photodiode 12. The controller 2 then generates an X-ray image according to the read signal.

Second Embodiment

Figure 6:
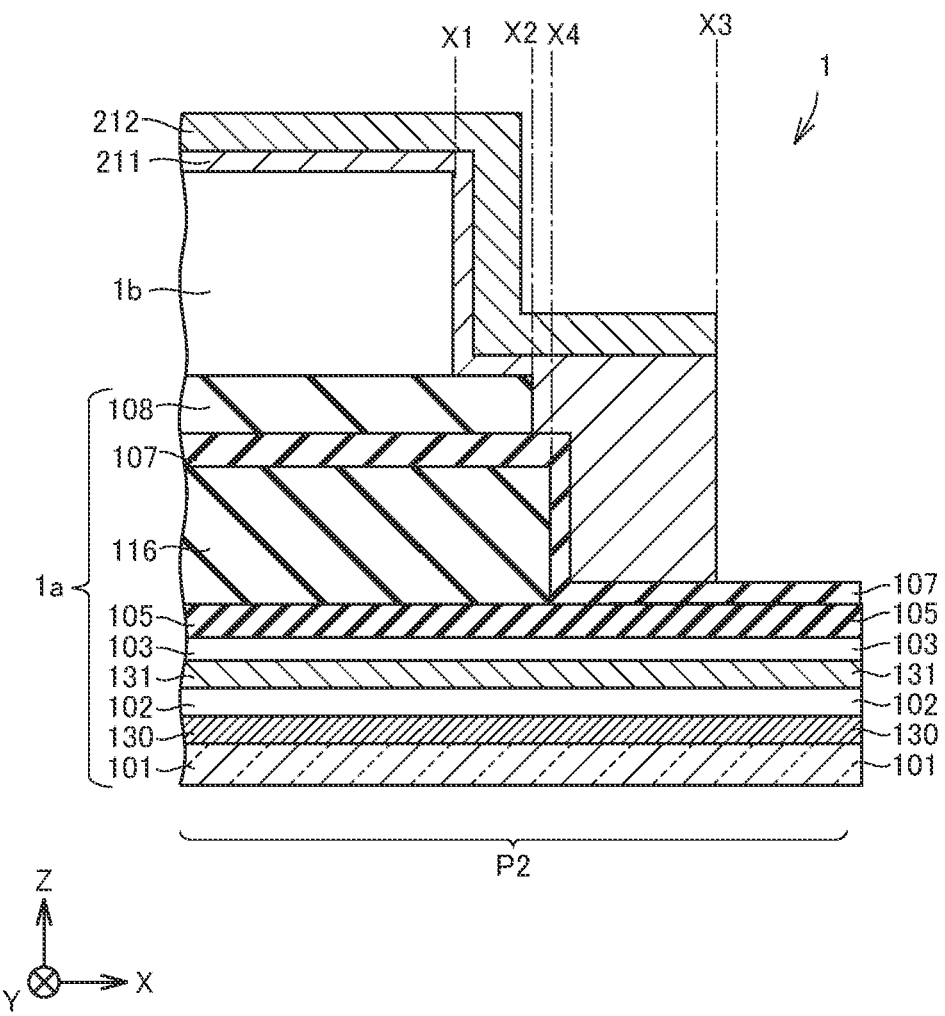
FIG. 6 is a sectional view of an end region in an imaging panel according to a second embodiment.

FIG. 6 is a sectional view of the end region P2 in an imaging panel according to the present embodiment. In FIG. 6, components identical to those according to the first embodiment are denoted by identical reference signs. Components different from those according to the first embodiment will be described below.

As shown in FIG. 6, the active matrix substrate 1a according to the present embodiment includes a third insulating film 116 (the second flattening film). The third insulating film 116 is made of the material same as that for the third insulating film 106 according to the first embodiment. The third insulating film 116 has an end, along the X axis, which is disposed at a position X4 between the boundary X3 of the adhesive layer region and the position X2 of the end of the fifth insulating film 108. The end of the third insulating film 116 is thus disposed inside the adhesive layer region and outside a region provided with the fifth insulating film 108.

The third insulating film 116 has a surface covered with the fourth insulating film 107. The adhesive layer 211 covers a surface of the fifth insulating film 108 as well as part of a surface of the fourth insulating film 107. The fourth insulating film 107 overlapped with the end, along the X axis, of the third insulating film 116 is covered with the adhesive layer 211. The end, along the X axis, of the third insulating film 116 is thus provided thereon with the fourth insulating film 107 and the adhesive layer 211, so as not to be exposed to outside air.

The end of the third insulating film 116 configured as a photosensitive resin film, as well as the fifth insulating film 108, are not exposed to outside air, so that the fifth insulating film 108 and the third insulating film 116 are less likely to allow moisture penetration. This configuration prevents from moisture penetration through the scintillator 1b through the fifth insulating film 108. This also prevents from moisture penetration, through the third insulating film 116, to the photodiode 12 and the TFT 13 in the pixel P1 disposed below the third insulating film 116, to be less likely to cause a flow of leakage current.

Third Embodiment

Figure 7:
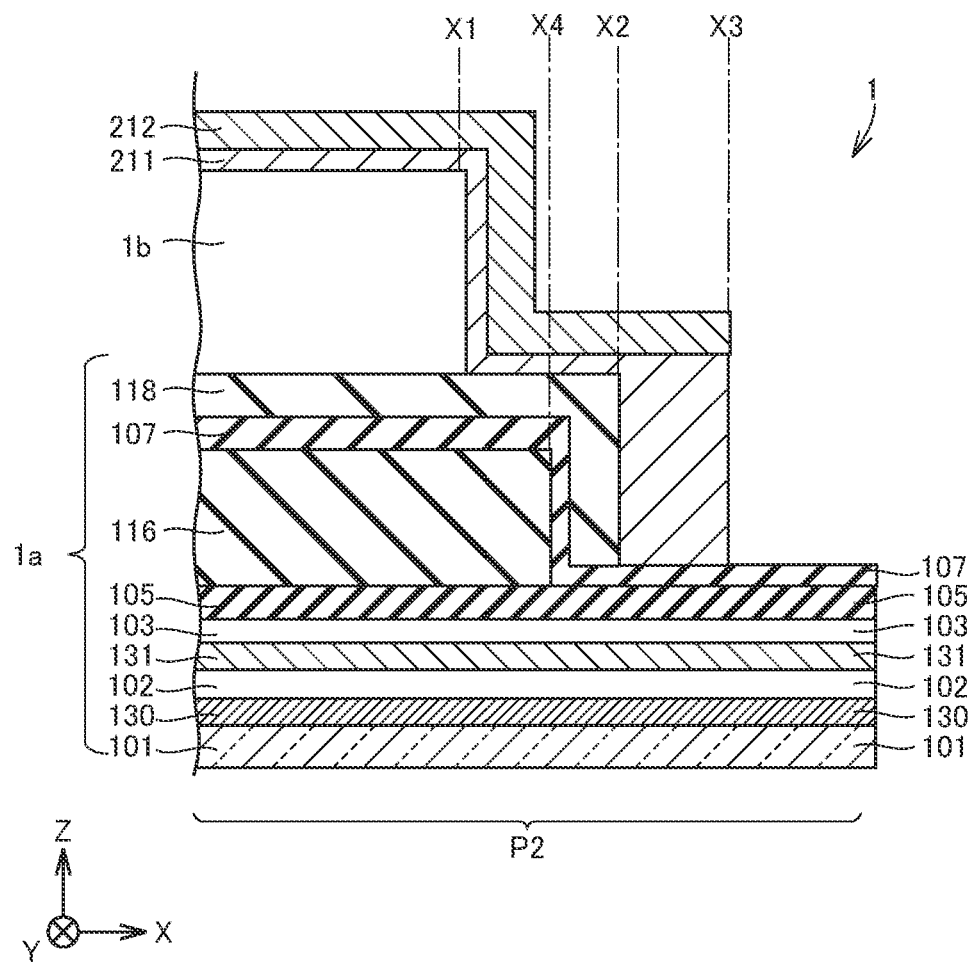
FIG. 7 is a sectional view of an end region in an imaging panel according to a third embodiment.

FIG. 7 is a sectional view of the end region P2 in an imaging panel according to the present embodiment. In FIG. 7, components identical to those according to the second embodiment are denoted by identical reference signs. Components different from those according to the second embodiment will be described below.

As shown in FIG. 7, the active matrix substrate 1a according to the present embodiment includes a fifth insulating film 118 (the first flattening film). The fifth insulating film 118 is made of the material same as that for the fifth insulating film 108 described above. The fifth insulating film 108 according to the second embodiment does not cover a portion of the fourth insulating film 107 overlapped with the end of the third insulating film 116. In contrast, the fifth insulating film 118 according to the present embodiment covers the portion of the fourth insulating film 107 overlapped with the end of the third insulating film 116. The adhesive layer 211 covers a surface of the fifth insulating film 118.

The third insulating film 116 according to the present example has the end, along the X axis, which is disposed at the position X4 between the boundary X1 of the scintillator region and the position X2 of the end, along the X axis, of the fifth insulating film 118. The end of the third insulating film 116 is provided thereon with the fourth insulating film 107, the fifth insulating film 118, and the adhesive layer 211.

The ends of the fifth insulating film 118 and the third insulating film 116 according to the present embodiment are not exposed to outside air, so that the fifth insulating film 118 and the third insulating film 116 are less likely to allow moisture penetration. This configuration prevents from moisture penetration to the scintillator 1b through the fifth insulating film 118. This can also prevent from moisture penetration, through the third insulating film 116, to the photodiode 12 and the TFT 13 in the pixel P1 disposed below the third insulating film 116, to be less likely to cause a flow of leakage current.

Fourth Embodiment

Figure 8A:
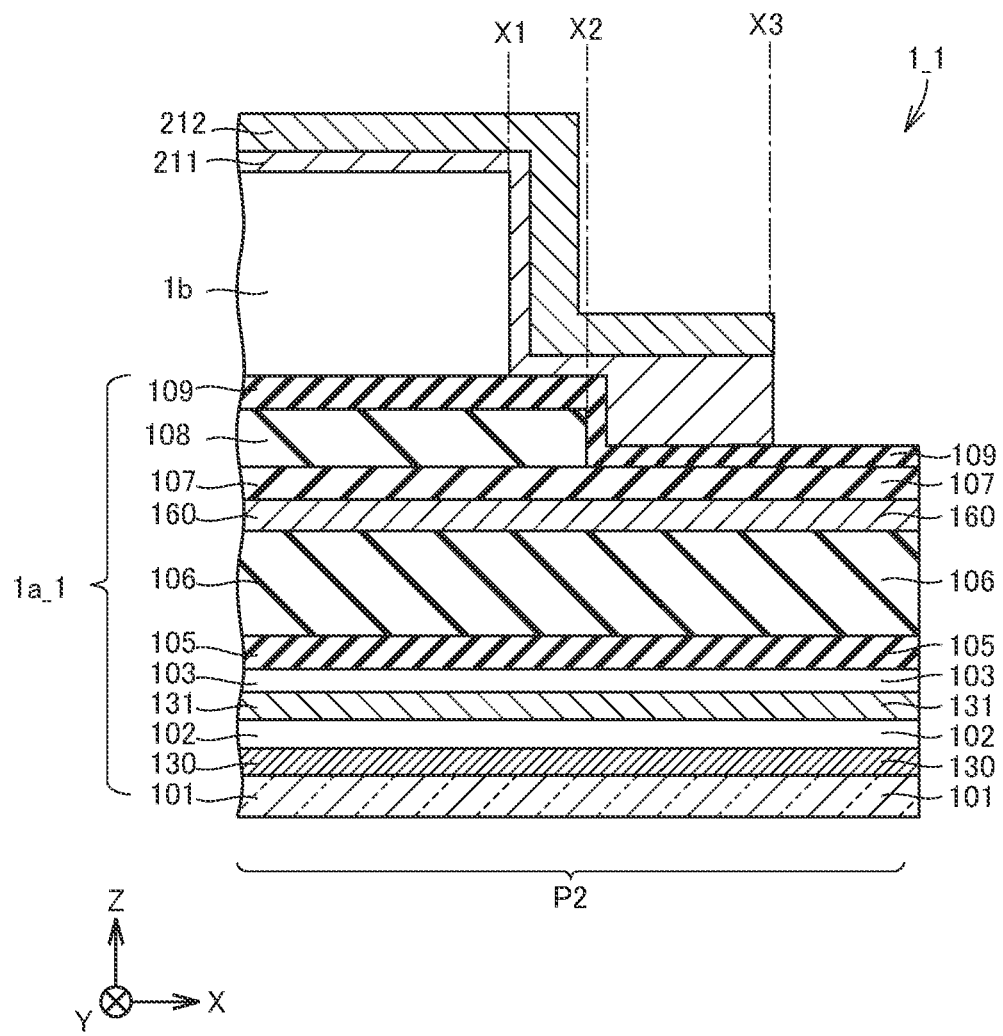
FIG. 8A is a sectional view of an end region in an imaging panel according to a fourth embodiment.

FIG. 8A is a sectional view of the end region P2 in an imaging panel according to the present embodiment. In FIG. 8A, components identical to those according to the first embodiment are denoted by identical reference signs. Components different from those according to the first embodiment will be described below.

Figure 8B:
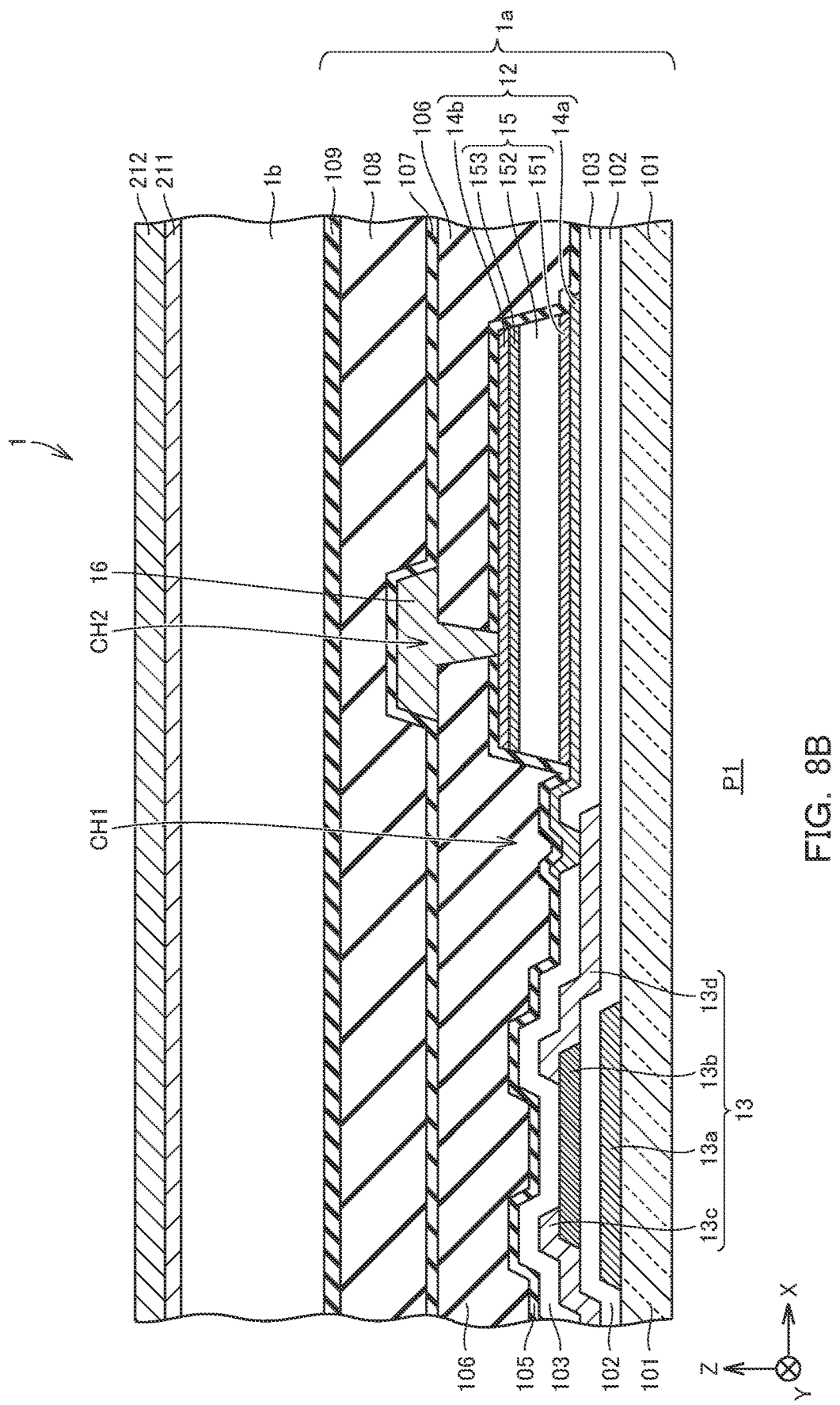
FIG. 8B is a sectional view of a pixel region in the imaging panel according to the fourth embodiment.

The present embodiment provides an imaging panel 1_1 including an active matrix substrate 1a_1 provided with a sixth insulating film 109 (the second inorganic film) covering the surface of the fifth insulating film 108. The sixth insulating film 109 is configured as an inorganic insulating film made of silicon oxide ($SiO_x$), silicon nitride ($SiN_x$), or the like. The sixth insulating film 109 may have a single layer structure including the single inorganic insulating film, or a layered structure including a plurality of inorganic insulating films. As shown in FIG. 8B, the sixth insulating film 109 is provided on the fifth insulating film 108 also in the pixel P1, to cover the fifth insulating film 108.

The sixth insulating film 109 is provided thereon with the scintillator 1b, and the adhesive layer 211 covers the scintillator 1b and part of a surface of the sixth insulating film 109.

The end, along the X axis, of the fifth insulating film 108 according to the present example is also covered with the sixth insulating film 109 in the end region P2 so as not to be exposed to outside air. The sixth insulating film 109 configured as an inorganic insulating film is lower in hygroscopicity than the fifth insulating film 108 configured as a photosensitive resin film. The fifth insulating film 108 is thus less likely to allow moisture penetration, to achieve preventing from moisture penetration into the scintillator 1b.

The fourth insulating film 107 and the sixth insulating film 109 each configured as an inorganic insulating film are layered to be overlapped in a planar view with the third insulating film 106 configured as a photosensitive resin film, so that moisture is less likely to permeate the third insulating film 106 from thereabove.

The fourth insulating film 107 covering the bias line 16 in the pixel P1 is likely to be thinner than the fourth insulating film 107 provided on the third insulating film 106 or be lost partially. The bias line 16 may be corroded by any moisture entering the fifth insulating film 108, in which case the moisture is likely to enter the photodiode 12 or the TFT 13 through a corroded portion of the bias line 16 or a lost portion of the fourth insulating film 107. The sixth insulating film 109 according to the present example covers the surface of the fifth insulating film 108 in the pixel P1 as shown in FIG. 8B, to be less likely to allow moisture penetration through the fifth insulating film 108. Even in such a case where the fourth insulating film 107 covering the bias line 16 has a thinner portion or a lost portion, this configuration prevents from corrosion of the bias line 16 and moisture penetration through the photodiode 12 and the TFT 13.

Fifth Embodiment

Figure 9:
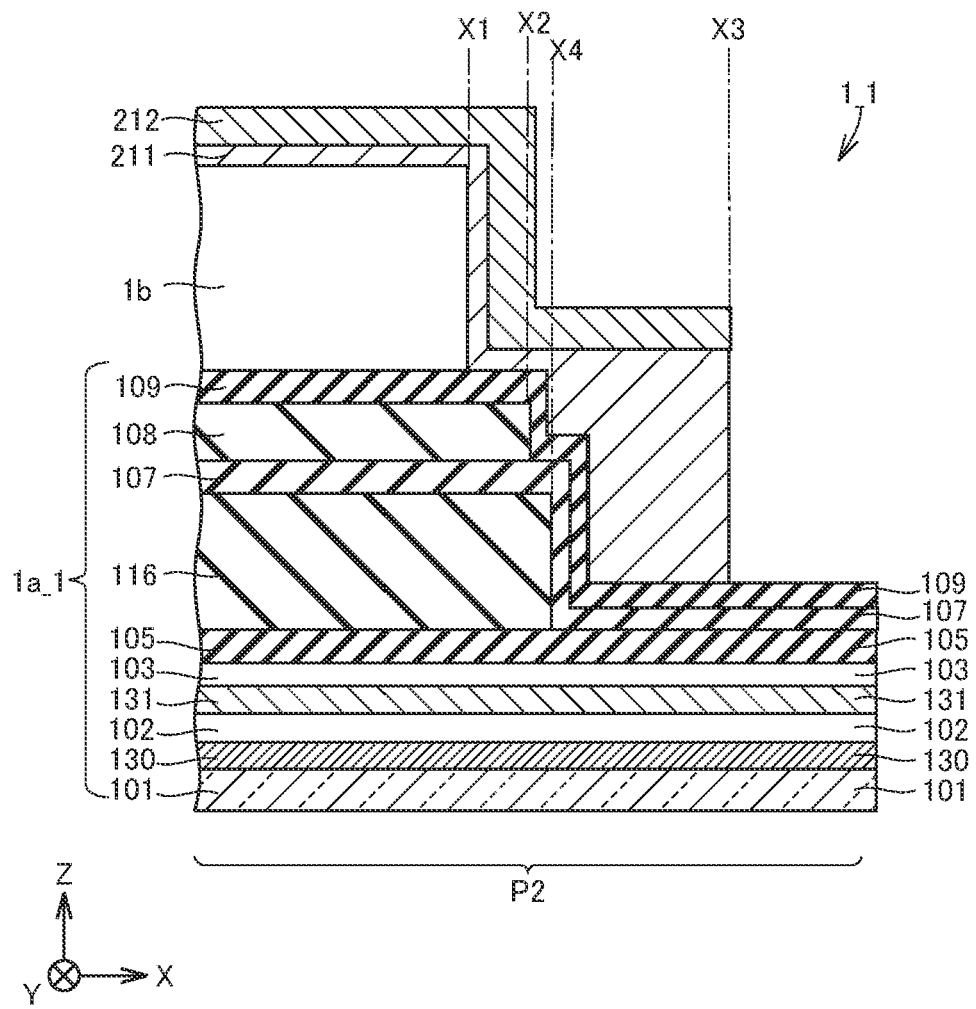
FIG. 9 is a sectional view of an end region in an imaging panel according to a fifth embodiment.

FIG. 9 is a sectional view of the end region P2 in an imaging panel according to the present embodiment. In FIG. 9, components identical to those according to the second embodiment are denoted by identical reference signs. Components different from those according to the second embodiment will be described below.

As shown in FIG. 9, the present embodiment provides an active matrix substrate having the configuration of the active matrix substrate 1a according to the second embodiment (see FIG. 6) and further including the sixth insulating film 109 similar to that according to the fourth embodiment.

The sixth insulating film 109 covers the surfaces of the fifth insulating film 108 and the fourth insulating film 107. The end, along the X axis, of the third insulating film 116 is thus provided thereon with two inorganic insulating films, namely, the fourth insulating film 107 and the sixth insulating film 109, as well as the adhesive layer 211. This configuration is less likely to allow moisture penetration through the end of the third insulating film 116 in comparison to the configuration according to the second embodiment.

The sixth insulating film 109 may be provided on the fifth insulating film 108 also in the pixel P1 to cover the fifth insulating film 108 as in the fourth embodiment. The sixth insulating film 109 thus configured prevents from moisture penetration through the fifth insulating film 118 in the pixel P1, to achieve preventing from corrosion of the bias line 16 and moisture penetration through the photodiode 12 and the TFT 13.

Sixth Embodiment

Figure 10:
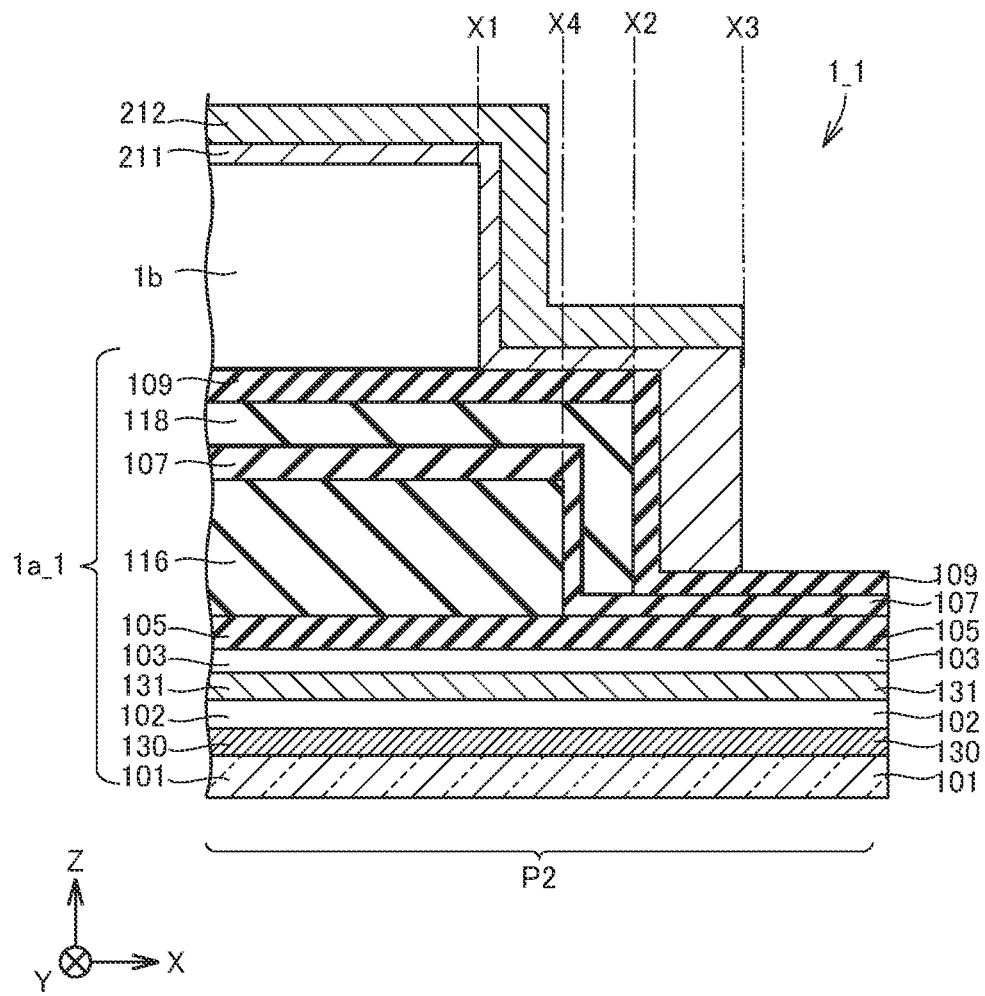
FIG. 10 is a sectional view of an end region in an imaging panel according to a sixth embodiment.

FIG. 10 is a sectional view of the end region P2 in an imaging panel according to the present embodiment. In FIG. 10, components identical to those according to the third embodiment are denoted by identical reference signs. Components different from those according to the third embodiment will be described below.

As shown in FIG. 10, the present embodiment provides an active matrix substrate having the configuration according to the third embodiment and further including the sixth insulating film 109 made of the material same as that of the fourth embodiment.

The sixth insulating film 109 covers the surfaces of the fifth insulating film 118 and the fourth insulating film 107. The end, along the X axis, of the third insulating film 116 is thus provided thereon with the fourth insulating film 107, the fifth insulating film 118, the sixth insulating film 109, and the adhesive layer 211. This configuration is less likely to allow moisture penetration through the end of the third insulating film 116 in comparison to the configuration according to the third embodiment.

The sixth insulating film 109 may be provided on the fifth insulating film 108 also in the pixel P1 to cover the fifth insulating film 108 as in the fourth embodiment. The sixth insulating film 109 thus configured inhibits moisture penetration through the fifth insulating film 118 in the pixel P1, to achieve preventing from corrosion of the bias line 16 and moisture penetration through the photodiode 12 and the TFT 13.

Seventh Embodiment

Figure 11:
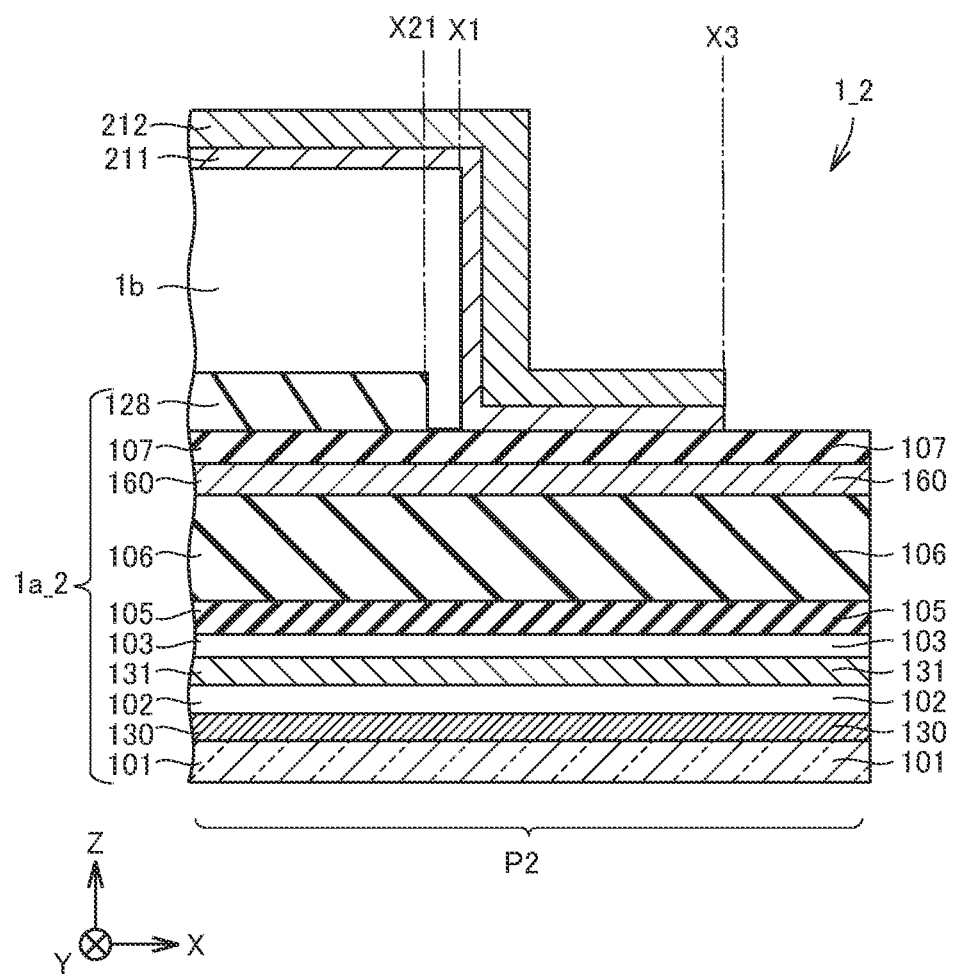
FIG. 11 is a sectional view of an end region in an imaging panel according to a seventh embodiment.

FIG. 11 is a sectional view of the end region P2 in an imaging panel according to the present embodiment. In FIG. 11, components identical to those according to the first embodiment are denoted by identical reference signs. Components different from those according to the first embodiment will be described below.

The end, along the X axis, of the fifth insulating film according to the first embodiment is positioned between the boundary of the adhesive layer region and the boundary of the scintillator region. The present embodiment is different from the first embodiment in that the end of the fifth insulating film is positioned inside the scintillator region.

As shown in FIG. 11, the present embodiment provides an imaging panel 1_2 including an active matrix substrate 1a_2 having a fifth insulating film 128 (the first flattening film). The fifth insulating film 128 is made of the material same as that for the fifth insulating film 108 described above. As shown in FIG. 11, the fifth insulating film 128 has an end, along the X axis, which is disposed at a position X21 closer to the pixel P1 (see FIG. 5A and the like) than the boundary X1 of the scintillator region, and the end of the fifth insulating film 128 is covered with the scintillator 1b.

The end of the fifth insulating film 128 according to the present embodiment is thus provided thereon with the scintillator 1b, the adhesive layer 211, and the damp-proof material 212 so as not to be exposed. The end of the fifth insulating film 128 is thus less likely to allow moisture penetration that is accordingly less likely to enter the scintillator 1b.

Eighth Embodiment

The third insulating film 106 according to the seventh embodiment has an end along the X axis, which is disposed outside the boundary X3 of the adhesive layer region (see FIG. 11). The present embodiment describes a configuration in which the end, along the X axis, of the third insulating film 106 is disposed inside the adhesive layer region.

Figure 12:
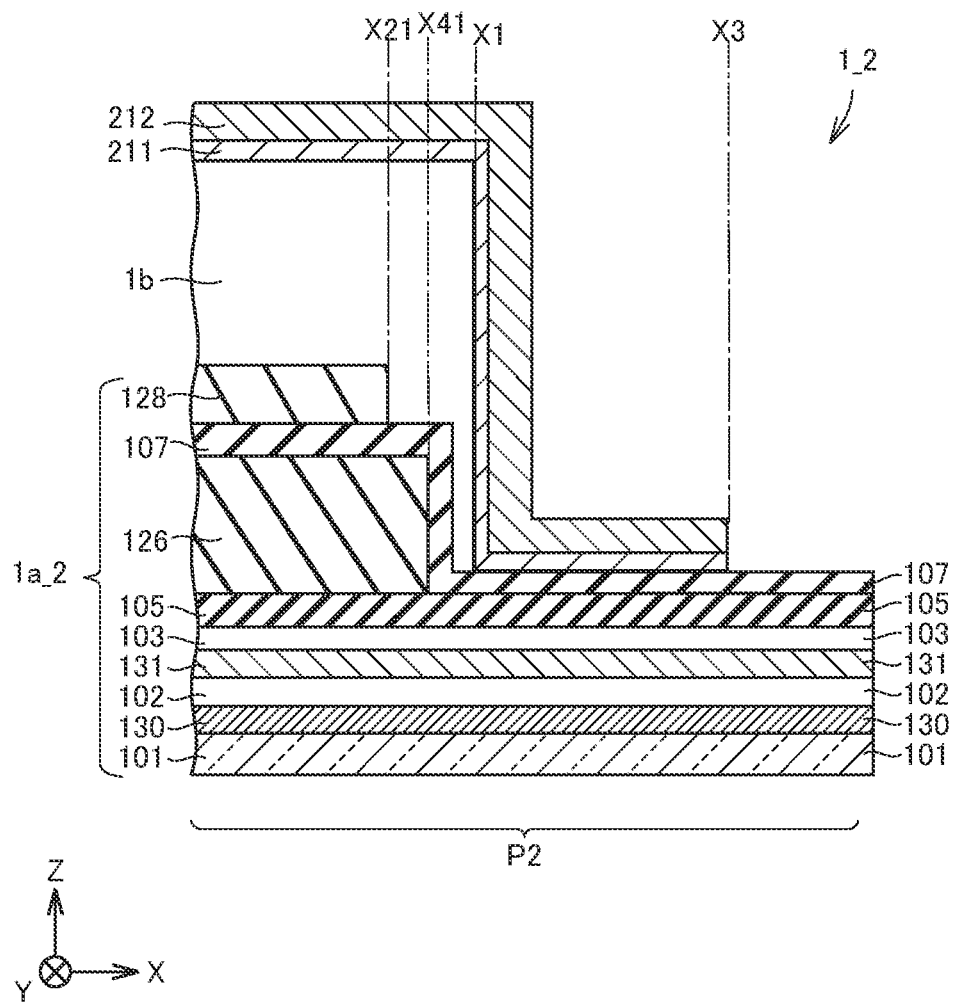
FIG. 12 is a sectional view of an end region in an imaging panel according to an eighth embodiment.

FIG. 12 is a sectional view of the end region P2 in an imaging panel according to the present embodiment. In FIG. 12, components identical to those according to the seventh embodiment are denoted by identical reference signs. Components different from those according to the seventh embodiment will be described below.

As shown in FIG. 12, the active matrix substrate 1a_2 in the imaging panel 1_2 according to the present embodiment includes a third insulating film 126 (the second flattening film). The third insulating film 126 is made of the material same as that for the third insulating film 106. The third insulating film 126 has an end, along the X axis, which is disposed at a position X41 between the position X21 of the end of the fifth insulating film 128 and the boundary X1 of the scintillator region.

The third insulating film 126 has a surface covered with the fourth insulating film 107. The scintillator 1b is provided on the fifth insulating film 128 and part of the fourth insulating film 107 so as to cover the fourth insulating film 107 that is overlapped with the end of the third insulating film 126.

The end of the third insulating film 126 according to the present embodiment is provided thereon with the fourth insulating film 107, the scintillator 1b, and the damp-proof material 212, so as not to be exposed. This configuration is less likely to allow moisture penetration through the end of the third insulating film 126 in comparison to the configuration according to the seventh embodiment. This prevents from moisture penetration through the photodiode 12 and the TFT 13 in the pixel P1 disposed below the third insulating film 126, to be less likely to cause a flow of leakage current.

Ninth Embodiment

Figure 13:
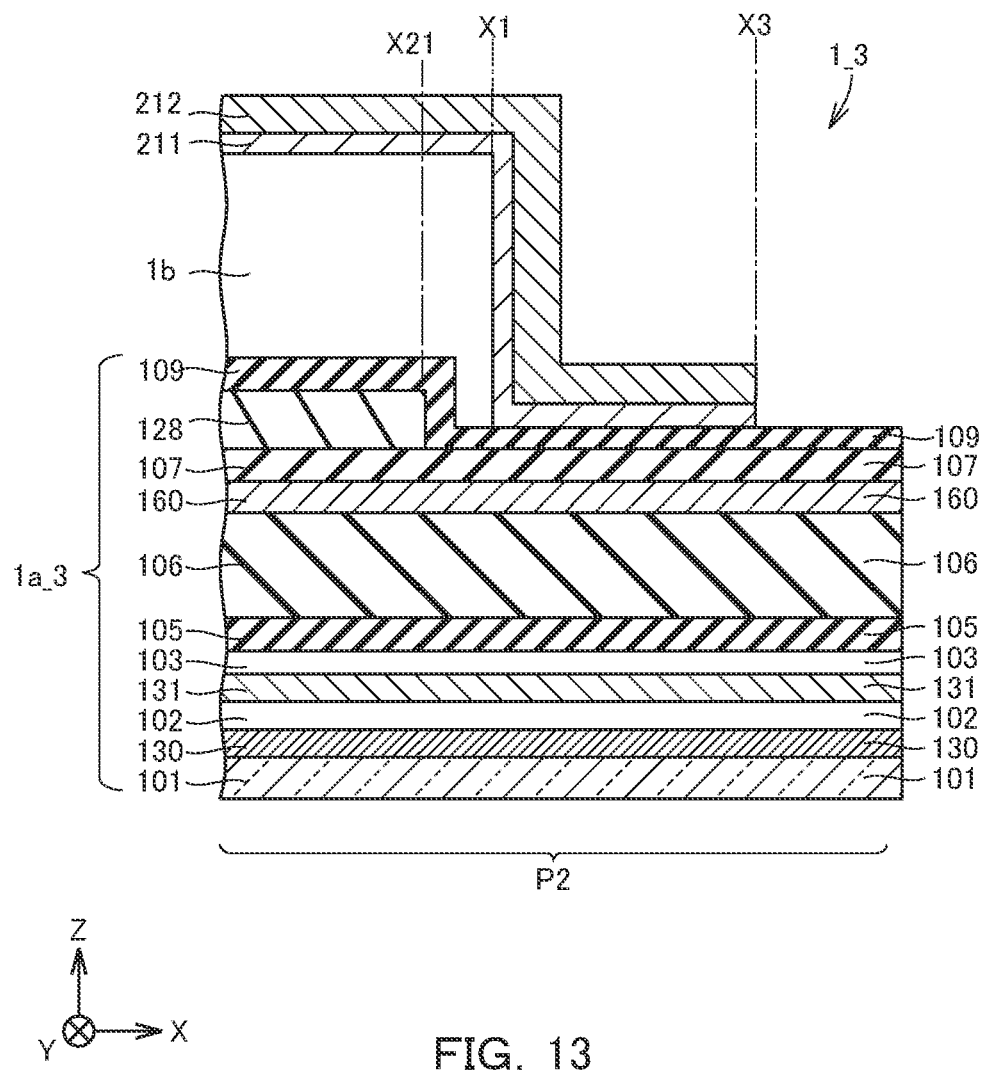
FIG. 13 is a sectional view of an end region in an imaging panel according to a ninth embodiment.

FIG. 13 is a sectional view of the end region P2 in an imaging panel according to the present embodiment. In FIG. 13, components identical to those according to the seventh embodiment are denoted by identical reference signs. Components different from those according to the seventh embodiment will be described below.

The present embodiment provides an imaging panel 1_3 including an active matrix substrate 1a_3 that has the configuration of the active matrix substrate 1a_2 according to the seventh embodiment and further includes the sixth insulating film 109 made of the material same as that of the fourth embodiment.

As shown in FIG. 13, the sixth insulating film 109 covers surfaces of the fifth insulating film 128 and the fourth insulating film 107. The end of the fifth insulating film 128 is disposed inside the scintillator region, and the scintillator 1b covers the portion of the sixth insulating film 109 overlapped with the end of the fifth insulating film 128.

The end, along the X axis, of the fifth insulating film 128 according to the present embodiment is provided thereon with the sixth insulating film 109, the scintillator 1b, the adhesive layer 211, and the damp-proof material 212. The sixth insulating film 109 configured as an inorganic insulating film is lower in hygroscopicity than the fifth insulating film 128. This configuration is less likely to allow moisture penetration through the end of the fifth insulating film 128 in comparison to the configuration according to the seventh embodiment.

The sixth insulating film 109 may be provided on the fifth insulating film 108 also in the pixel P1 to cover the fifth insulating film 108 as in the fourth embodiment. The sixth insulating film 109 thus configured prevents from moisture penetration through the fifth insulating film 118 in the pixel P1, to achieve preventing from corrosion of the bias line 16 and moisture penetration through the photodiode 12 and the TFT 13.

Tenth Embodiment

Figure 14:
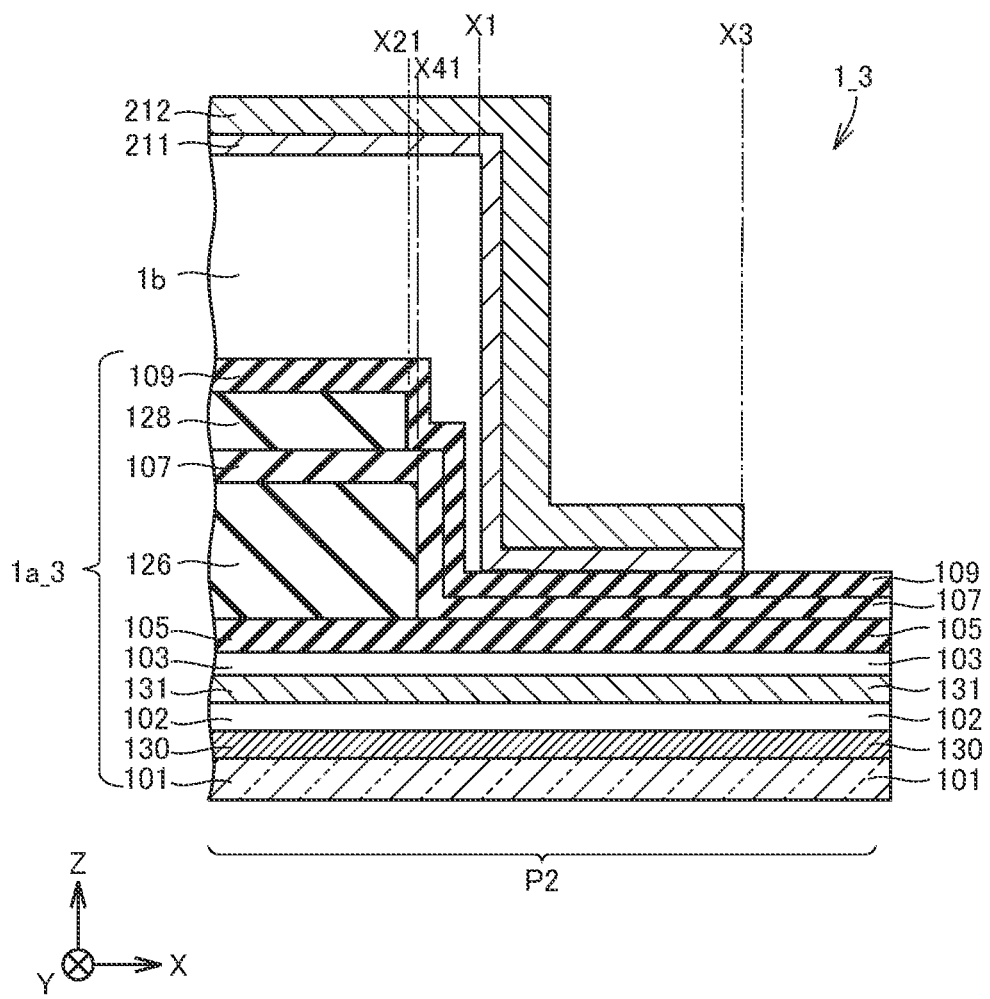
FIG. 14 is a sectional view of an end region in an imaging panel according to a tenth embodiment.

FIG. 14 is a sectional view of the end region P2 in an imaging panel according to the present embodiment. In FIG. 14, components identical to those according to any one of the eighth and ninth embodiments are denoted by identical reference signs. Components different from those according to the eighth embodiment will be described below.

As shown in FIG. 14, the active matrix substrate 1a_3 according to the present embodiment has the configuration of the active matrix substrate 1a_2 according to the eighth embodiment (see FIG. 12) and further includes the sixth insulating film 109 made of the material same as that of the fourth embodiment.

The sixth insulating film 109 covers the surfaces of the fifth insulating film 128 and the fourth insulating film 107. The end of the third insulating film 126 according to the present embodiment is provided thereon with two inorganic insulating films, namely, the fourth insulating film 107 and the sixth insulating film 109. This configuration is less likely to allow moisture penetration through the end of the third insulating film 126 in comparison to the configuration according to the eighth embodiment.

The sixth insulating film 109 may be provided on the fifth insulating film 108 also in the pixel P1 to cover the fifth insulating film 108 as in the fourth embodiment. The sixth insulating film 109 thus configured prevents from moisture penetration through the fifth insulating film 118 in the pixel P1, to achieve prevent from corrosion of the bias line 16 and moisture penetration through the photodiode 12 and the TFT 13.

The embodiments of the present invention described above are merely exemplified for implementation of the present invention. The present invention should not be limited to the embodiments described above, and can be implemented with appropriate modifications to the above embodiments without departing from the spirit of the present invention.

(1) In the first to tenth embodiments described above, the second insulating film 105 in contact with one of the surfaces of the third insulating film 106, 116, or 126 (the second flattening film) is preferred to be provided continuously from the pixel P1 to the end region P2. The second insulating film 105 is preferred to be provided with no opening from the pixel P1 to the end region P2. The second insulating film 105 is configured as an inorganic insulating film and is lower in hygroscopicity than the third insulating film configured as a photosensitive resin film. The second insulating film 105 provided continuously from the pixel P1 to the end region P2 prevents from moisture penetration through the third insulating film from below the second insulating film 105.

(2) Each of the fifth insulating film and the third insulating film according to any one of the first to tenth embodiments may be made of a positive or negative photosensitive resin material.

The invention claimed is:

1. An imaging panel comprising:
an active matrix substrate having a pixel region provided with a plurality of pixels each including a photoelectric conversion element;
a scintillator provided on a surface of the active matrix substrate and configured to convert an X-ray to scintillation light;
a damp-proof material covering the active matrix substrate and the scintillator; and
an adhesive layer bonding the damp-proof material to the scintillator and the active matrix substrate; wherein
the active matrix substrate includes
a first flattening film provided to be overlapped in a planar view with the scintillator and configured as a photosensitive resin film, and
the first flattening film is entirely disposed, in a planar view, inside an adhesive layer region provided with the adhesive layer.

2. The imaging panel according to claim 1, wherein the first flattening film has an end that is disposed in a planar view between a boundary of a scintillator region provided with the scintillator and a boundary of the adhesive layer region, and is covered with the adhesive layer.

3. The imaging panel according to claim 2, wherein
the first flattening film has a first surface in contact with the scintillator,
the active matrix substrate further includes
a first inorganic film provided on a second surface of the first flattening film, and
a second flattening film provided on a surface, not facing the first flattening film, of the first inorganic film,
the second flattening film has an end that is disposed in a planar view between the end of the first flattening film and the boundary of the adhesive layer region and is covered with the first inorganic film, and
the first inorganic film has a portion overlapped with the end of the second flattening film and covered with the adhesive layer.

4. The imaging panel according to claim 2, wherein
the first flattening film has a first surface in contact with the scintillator,
the active matrix substrate further includes
a first inorganic film provided on a second surface of the first flattening film, and
a second flattening film provided on a surface, not facing the first flattening film, of the first inorganic film,
the second flattening film has an end that is disposed in a planar view between the end of the first flattening film and the boundary of the scintillator region and is covered with the first inorganic film, and
the first inorganic film has a portion overlapped with the end of the second flattening film and covered with the first flattening film.

5. The imaging panel according to claim 1, wherein
the active matrix substrate further includes
a first inorganic film provided on a surface, not facing the scintillator, of the first flattening film, and
a second inorganic film provided between the first flattening film and the scintillator,
the first flattening film has a surface covered with the second inorganic film, and
the second inorganic film has a portion overlapped with an end of the first flattening film and covered with the adhesive layer.

6. The imaging panel according to claim 5, wherein
the active matrix substrate further includes a second flattening film provided to oppose the first flattening film with the first inorganic film being interposed therebetween, and configured as a photosensitive resin film,
the second flattening film has an end that is disposed in a planar view between the end of the first flattening film and a boundary of the adhesive layer region and is covered with the first inorganic film, and
the first inorganic film has a portion overlapped with the end of the second flattening film and covered with the second inorganic film.

7. The imaging panel according to claim 5, wherein
the active matrix substrate further includes a second flattening film provided to oppose the first flattening film with the first inorganic film being interposed therebetween, and configured as a photosensitive resin film,
the second flattening film is entirely disposed, in a planar view, inside the first flattening film, and
the first inorganic film has a portion overlapped with an end of the second flattening film and covered with the first flattening film.

8. The imaging panel according to claim 1, wherein the first flattening film has a first surface in contact with the scintillator, and the first flattening film has an end covered with the scintillator.

9. The imaging panel according to claim 8, wherein
the active matrix substrate further includes
a first inorganic film provided on a second surface of the first flattening film, and
a second flattening film provided on a surface, not facing the first flattening film, of the first inorganic film,
the second flattening film has an end that is disposed in a planar view between the end of the first flattening film and a boundary of a region provided with the scintillator, and is covered with the first inorganic film, and
the first inorganic film has a portion overlapped with the end of the second flattening film and covered with the scintillator.

10. The imaging panel according to claim 8, wherein
the active matrix substrate further includes a first inorganic film provided on a surface, not facing the scintillator, of the first flattening film, and a second inorganic film in contact with the first flattening film and the scintillator, the end of the first flattening film is covered with the second inorganic film, and the second inorganic film has a portion overlapped with the end of the first flattening film and covered with the scintillator.

11. The imaging panel according to claim 10, wherein the active matrix substrate further includes a second flattening film provided to oppose the first flattening film with the first inorganic film being interposed therebetween, and configured as a photosensitive resin film, the second flattening film has an end that is disposed in a planar view between the end of the first flattening film and a boundary of a region provided with the scintillator, and is covered with the first inorganic film, and the first inorganic film has a portion overlapped with the end of the second flattening film and covered with the second inorganic film.

* * * * *